United States Patent [19]
Fujita et al.

[11] Patent Number: 5,042,917
[45] Date of Patent: Aug. 27, 1991

[54] LIQUID CRYSTAL MATRIX DISPLAY UNIT

[75] Inventors: Shingo Fujita; Hiroshi Yamazoe, both of Katano; Isao Ota; Isako Kikuchi, both of Osaka, all of Japan

[73] Assignee: Matsushita Electric Industrial Co., Ltd., Osaka, Japan

[21] Appl. No.: 319,814

[22] Filed: Mar. 7, 1989

Related U.S. Application Data

[63] Continuation of Ser. No. 40,473, Apr. 20, 1987, abandoned.

[30] Foreign Application Priority Data

Apr. 25, 1986 [JP] Japan .................................. 61-97151
Apr. 25, 1986 [JP] Japan .................................. 61-97158

[51] Int. Cl.[5] .......................... G02F 1/13; H01L 45/00; H01L 21/20
[52] U.S. Cl. .......................................... 359/60; 357/2; 437/101; 359/72; 359/79; 359/87
[58] Field of Search ........... 350/332, 333, 334, 339 R, 350/342; 357/2, 4, 23.7; 437/101

[56] References Cited

U.S. PATENT DOCUMENTS

| 4,062,034 | 12/1977 | Matsushita et al. | 357/2 |
| 4,204,217 | 5/1980 | Goodman | 350/334 |
| 4,226,898 | 10/1980 | Ovshinsky et al. | 357/2 |
| 4,589,733 | 5/1986 | Yaniv et al. | 350/332 |
| 4,597,162 | 7/1986 | Johnson | 357/2 |
| 4,653,858 | 3/1987 | Szydlo et al. | 350/332 |

OTHER PUBLICATIONS

Ugai et al., "Diagonal Color LCD Addressed by a-Si TFTS", Proceedings of the SID, vol. 26/Jan. 1985.
Togashi et al., "An LC-TV Display Controlled by a-Si Diode Rings", Proceedings of the SID, vol. 26, Jan. 1985.

*Primary Examiner*—Stanley D. Miller
*Assistant Examiner*—Trong Phan
*Attorney, Agent, or Firm*—Wenderoth, Lind and Ponack

[57] ABSTRACT

A nonlinear diode which is easy to manufacture and has sharply nonlinear voltage-current characteristic and a matrix display unit in which it is used has a diode structure in which an amorphous semiconductor layer is disposed between a bus bar and a pixel electrode formed on a substrate so as to thereby provide an electrical connection therebetween. The amorphous semiconductor layer is made of a compound of arsenic and at least one of selenium and sulphur; a compound of nitrogen and at least one of boron; silicon; aluminium and gallium, a compound of carbon and silicon; or boron.

25 Claims, 6 Drawing Sheets

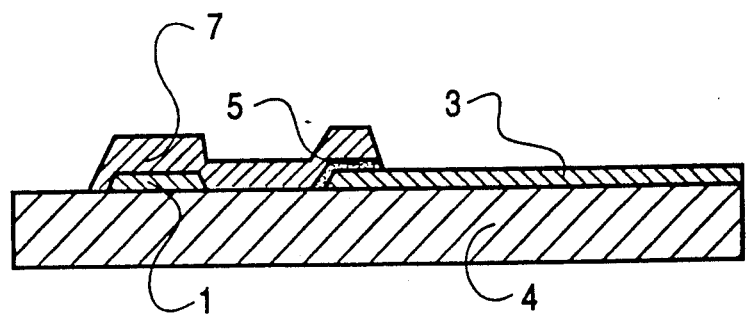
FIG. 3(a)
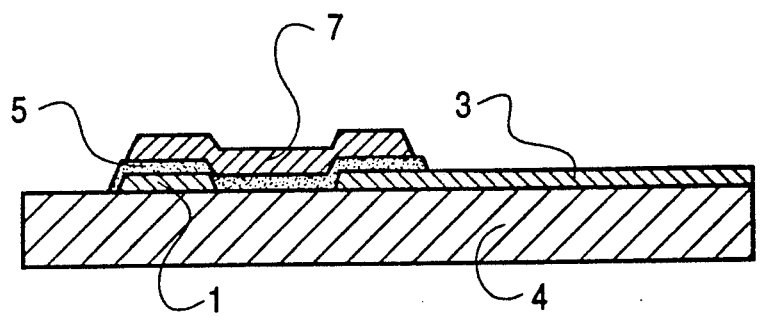
FIG. 4(a)
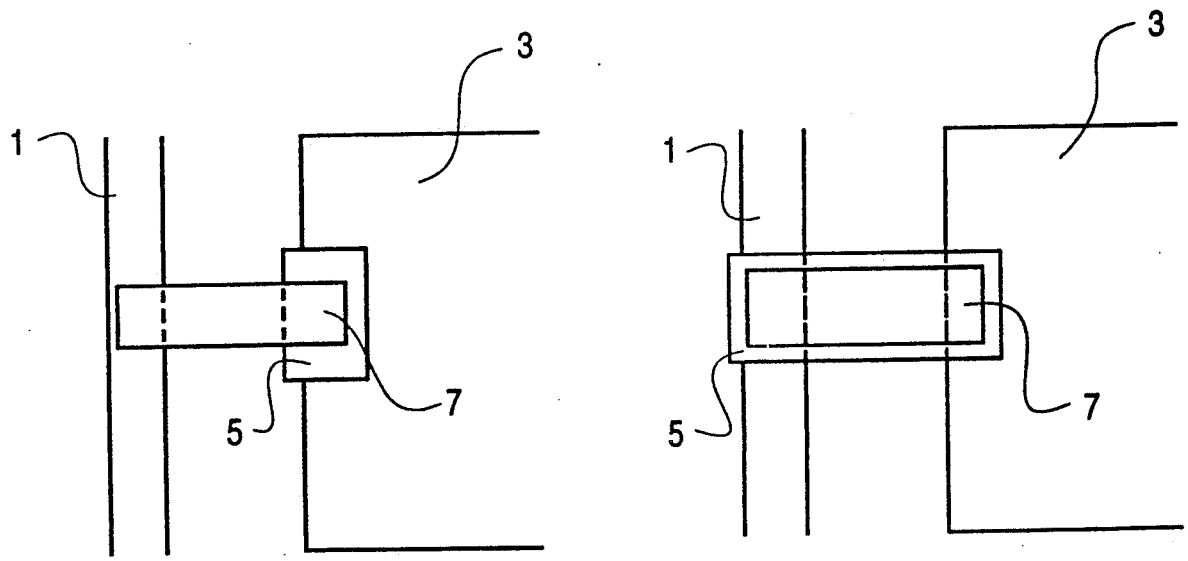
FIG. 3(b)          FIG. 4(b)

LIQUID CRYSTAL MATRIX DISPLAY UNIT

This application is a continuation of now abandoned application Ser. No. 07/040,473, filed Apr. 20, 1987.

BACKGROUND OF THE INVENTION

1. Field of the invention

This invention relates to a matrix display unit which is suitable to a large size and high resolution display, and more concretely to a matrix display using nonlinear diodes.

2. Description of the Prior Art

Majority of the conventional matrix display units using nonlinear diodes as drive elements use liquid crystal as the display medium.

Applications of the liquid crystal display (LCD) units have been expanded from watches, calculators, etc. to computer terminals and picture displays. Thus, they have been required to be higher in resolution and larger in display area. There have been known passive-matrix addressing type and active-matrix addressing type LCDs. The latter type includes a type which uses transistors such as thin film transistors (TFTs) and a type which uses nonlinear diodes. Each method has its own advantages and disadvantages. The passive-addressing type is poor in resolution, particularly when a large number of scanning electrodes are used. The transistor driving type requires a complicated manufacturing process, thus being higher in cost. The type using nonlinear diodes is easier to manufacture than the type using transistors, which contributes to cost reduction, and is suitable to construct a large panel.

The matrix liquid crystal display unit using nonlinear diodes mainly includes the following two kinds:

A first one is of a type which uses metal-insulator-metal(MIM) devices. ["The Optimization of Metal-Insulator-Metal devices for use in Multiplexed Liquid Crystal Displays", D. R. Baraff et al, IEEE Transaction of Electron Devices, vol. ED-28, No. 6 pp 736-739, June, 1981]. Tantalum oxide ($Ta_2O_5$) has been most frequently used as an insulator. The nonlinearity of the voltage-current characteristic is attributed to the Poole-Frankel effect. A second one is of a type which uses diode rings ["A LCTV Display Controlled by a Si Diode Rings", S. Togashi, et al, SID 84 Digest, 1984, 18. 6, pp. 324-325]. The diode ring is composed of two amorphous silicon (a Si) PIN diodes which are connected in a ring form. This nonlinear diode utilizes the forward characteristic of the PIN diode.

The use of these nonlinear diodes makes it possible to reduce a crosstalk voltage, so that a large-scale display capacity can be realized when compared with the passive-matrix addressing type.

Since each nonlinear diode must be applied with an adequately high voltage to drive each pixel element, it must be designed to have an electric capacitance not exceeding about one-tenth of that of the pixel element. The MIM device is made smalled-sized because of the large relative dielectric constant of tantalum oxide (at least 20), which causes the yield decrease greatly. In addition, it requires during manufacturing at least three photolithography steps, which are complex to operate as well as require a lot of time to finish.

The diode ring requires at least five to six photolithography steps during manufacturing, which results in reduced yield and increased cost.

SUMMARY OF THE INVENTION

An object of this invention is to provide a nonlinear diode which is easy to manufacture and has a sufficiently large nonlinear voltage-current characteristic, and a matrix display unit using the same.

A matrix display unit in accordance with this invention comprises substrates confronting to each other, a display medium layer which is held between the substrates, a plurality of bus bars which are formed on at least one of the substrates, a plurality of pixel electrodes which are provided with respect to each of the plurality of bus bars, and an amorphous semiconductor layer which is formed between the each bus bar and each of the plurality of pixel electrodes so as to provide an electrical connection there-between. The amorphous semiconductor layer is made of a compound of arsenic and at least one of selenium and sulphur; or a compound of nitrogen and at least one of boron, silicon, aluminum and gallium; or a compound of carbon and silicon; or boron.

A nonlinear voltage-current characteristic appears in the nonlinear element portion where the amorphous semiconductor layer is provided between the bus bar and pixel electrode. The nonlinearity is caused less at the junction between the conductor layer and semiconductor layer, but can be thought to be caused largely due to the bulk effect of the amorphous semiconductor layer. By disposing such element between the bus bar and pixel electrode, a ratio of ON- and OFF-voltages applied to the pixel portion can be increased, which contributes to an increase in contrast.

Also, each of the above listed amorphous semiconductor materials has a relatively small relative dielectric constant value (at most 20) so that the nonlinear element can be made relatively small in size, which leads to an increase in the yield during manufacturing.

Furthermore, when the amorphous semiconductor layer is formed by the evaporation technique, no substrate heating process is required, so that the evaporation technique with a metal mask can be employed for forming it. As a result, the complicated photolithography process can be eliminated, thus further increasing the yield during manufacturing.

DESCRIPTION OF THE PREFERRED EMBODIMENTS

Figure 1:
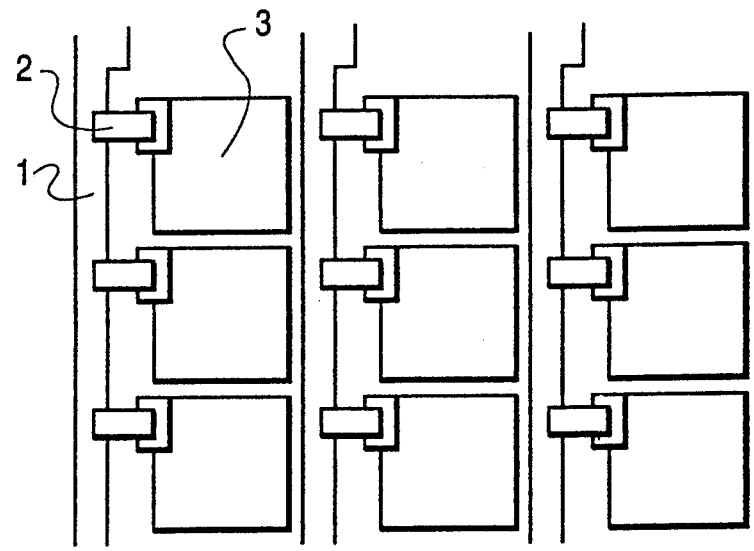
FIG. 1 is a partial plan view of an embodiment of matrix display unit is accordance with this invention.

Hereinafter, the embodiments of this invention will be described by referring to the drawings.

First, a wiring diagram of electrodes formed on a substrate for use in a matrix display unit of this invention is shown in FIG. 1. In which, a nonlinear element 2 is formed between a bus bar 1 and a pixel electrode 3.

First, the fundamental structures of the nonlinear element of this invention will be described below.

Figure 2A:
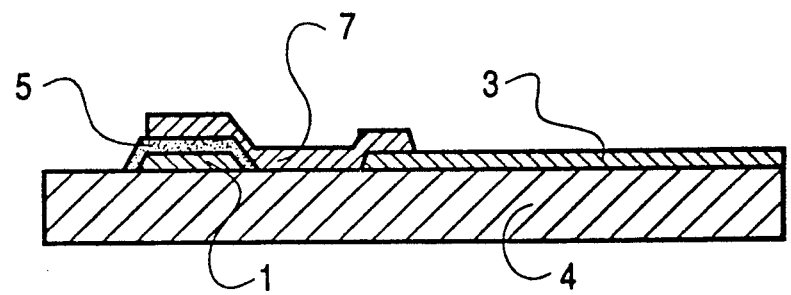
FIG. 2(a) and (b), FIGS. 3(a) and (b) and FIGS. 4(a) and (b) show fundamental structures of nonlinear elements in accordance with this invention, respectively, in each of which, (a) and (b) are a sectional view and a plan view, respectively.
Figure 2B:
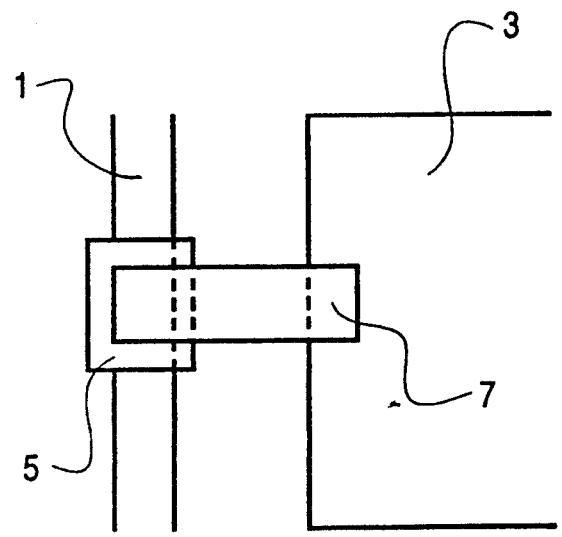

The structure of a nonlinear element of a first embodiment of this invention is shown in FIGS. 2(a) and (b). A bus bar 1 is formed on a substrate 4, an amorphous semiconductor layer 5 is formed on the bus bar 1, and a second connection electrode 7 is formed for electrically connecting the amorphous semiconductor layer 5 and a pixel electrode 3.

FIGS. 3(a) and (b) show the structure of a nonlinear element of a second embodiment of this invention, which differs from the structure of the first embodiment in that an amorphous semiconductor layer 5 is formed on a pixel electrode 3. The nonlinear elements of the both structures have a same electrical characteristic regardless of the positions where the amorphous semiconductor layer 5 is formed.

FIGS. 4(a) and (b) show a third embodiment of this invention, in which an amorphous semiconductor layer 5 is formed by the vacuum vapor deposition technique so as to bridge both of a bus bar 1 and a pixel electrode 3 which are formed on a substrate 4, and then a second connection electrode 7 is vacuum-deposited thereon. This structure is equivalent to the structure in which two nonlinear elements are connected in series, and a nonlinear voltage-current characteristic can be obtained in the same way as obtained in FIGS. 2(a) and (b) and FIGS. 3(a) and (b). An advantage of the structure shown in FIGS. 4(a) and (b) is that the amorphous semiconductor layer 5 and second connection electrode 7 can be formed with the same mask.

As described above, from the viewpoint of the position where the amorphous semiconductor layer 5 is formed, the structures of the nonlinear elements can be classified into three types: formed on the bus bar (see FIGS. 2(a) and (b)); formed on the pixel electrode (see FIGS. 3(a) and (b)); and formed on the both (see FIGS. 4(a) and (b)). Any of these types exhibits the same electrical characteristic. Thus, the following description will be limited to the case that the amorphous semiconductor layer is formed on the pixel electrode, because the effects do not depend on the position of the amorphous semiconductor layer.

On the other hand, the structures can be classified into four types on the laminated structural basis.

A first type is shown in FIGS. 3(a) and (b), which has a pattern of bus bar/semiconductor layer/second connection electrode/pixel electrode.

Figure 5A:
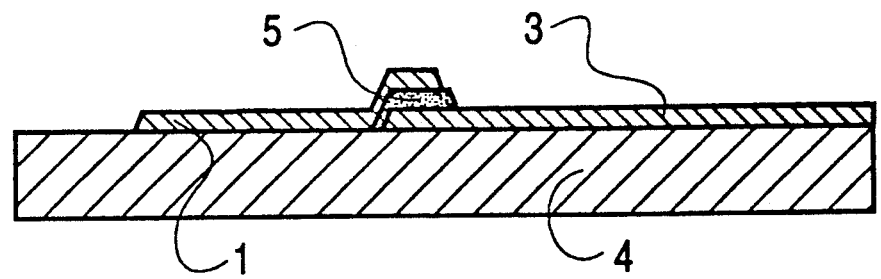
FIGS. 5(a) and (b), FIGS. 6(a) and (b), FIGS. 7(a) and (b), FIGS. 8(a) and (b) and FIGS. 9(a) and (b) are laminated structures of nonlinear elements in accordance with this invention, respectively, in each of which, (a) and (b) are a sectional view and a plan view, respectively.
Figure 5B:
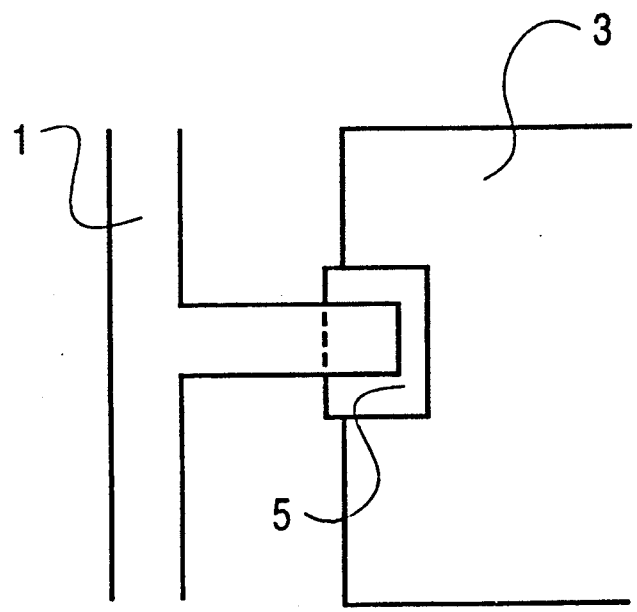

A second type is shown in FIGS. 5(a) and (b), in which a bus bar 1 also serves to act as the second connection electrode 7.

Figure 6A:
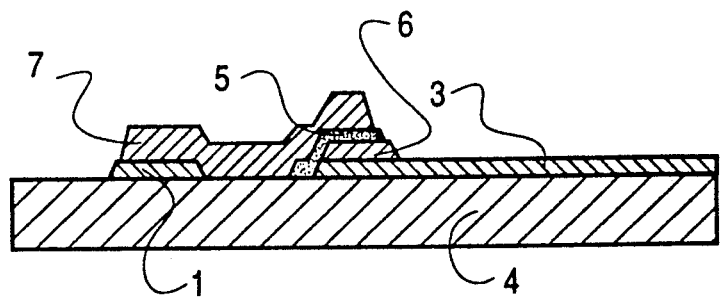

A third type is shown in FIGS. 6(a) and (b). This is such a structure that a first connection electrode 6 is formed between the amorphous semiconductor layer 5 and pixel electrode 3. Both of the first connection electrode 6 and second connection electrode 7 are preferably made of a same kind of conductive material. Thus, a symmetrical structure is obtained, so that the symmetrization of electrical characteristics can be assured.

Figure 7A:
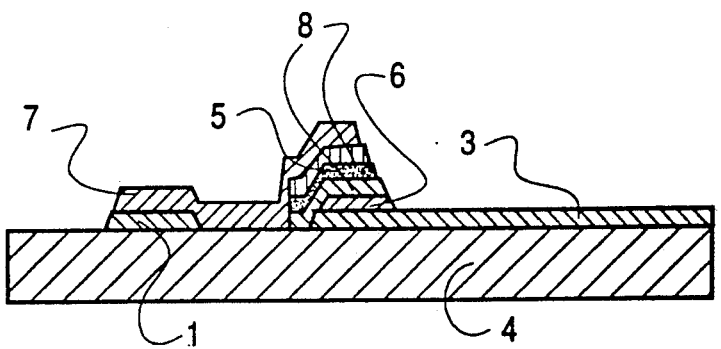
Figure 6B:
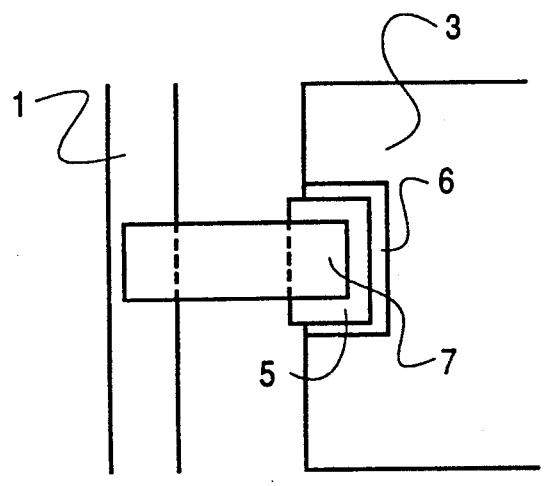
Figure 7B:
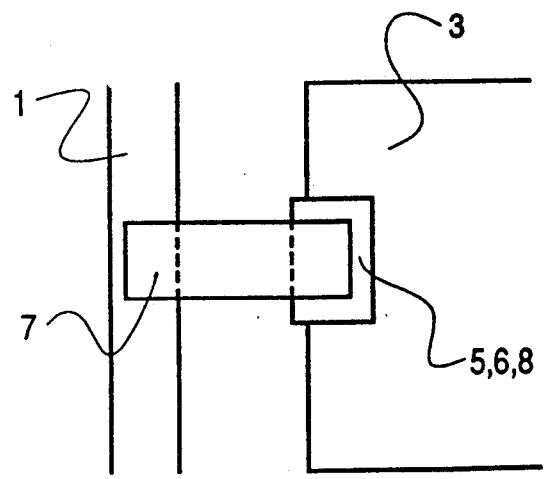

Also, a fourth type is shown in FIGS. 7(a) and (b), which is so structured that silicon layers 8 are formed between the amorphous semiconductor layer 5 and the first connection electrode 6 and between the layer 5 and the second connection electrode 7, respectively. The formation of the silicon layers 8 offers advantages of making the electrical characteristics more stable and the Off-current lower.

Figure 8A:
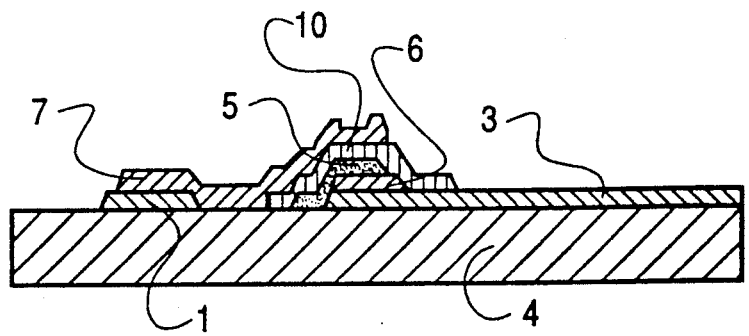

Also, another structure of nonlinear element is shown in FIGS. 8(a) and (b). It is made up in such a way that an insulator layer 9 is formed on the amorphous semiconductor layer 5 of the structure shown in FIGS. 6(a) and (b), and a predetermined patterning is carried out thereby to form a contact hole 10. This is for the purpose to increase the uniformity of the electrical characteristics between the elements. Even if the insulator layer 9 is formed between an amorphous semiconductor layer 5 and first connection electrode 6, the same electrical characteristics will be obtainable.

Figure 9A:
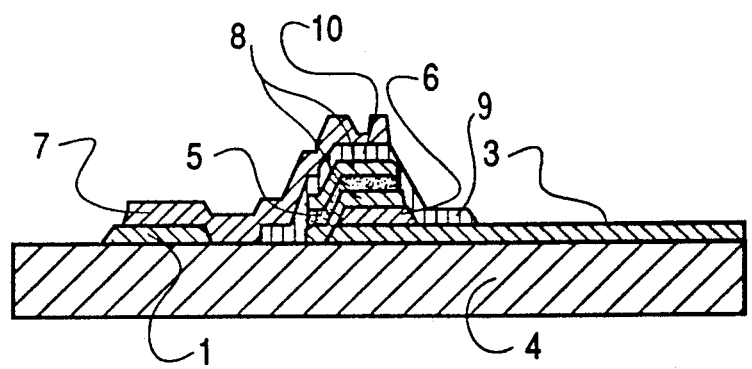

In addition, it is obvious that the structure having the insulator layer 9 formed as shown above also is applicable to the laminated structures other than the that shown in FIGS. 6(a) and (b). For example, FIGS. 9(a) and (b) are an example that the insulator layer 9 is applied to the element structure of FIGS. 7(a) and (b), in which it is formed between the upper silicon layer 8 and the second connection electrode 7. Particularly, for the structure shown in FIGS. 7(a) and (b), it has been confirmed that the same results are obtainable whether the insulator layer 9 is formed on the upper or lower silicon layer 8.

Next, the detailed description of examples of the embodiment of this invention will be shown below. However, it will be made mainly on a liquid crystal display unit because liquid crystal has been most practically realized as the display medium of a matrix display unit in which a nonlinear element is used.

EXAMPLE 1

A nonlinear element of the laminated structure shown in FIGS. 8(a) and (b) will be described below.

After an transparent electrode made of indium-tin-oxide (ITO) was formed on a substrate 4 by using the electron beam evaporation method, a bus bar 1 and a pixel electrode 3 were patterned by a photolithographic process.

A position alignment was made using an aligner between the substrate and an evaporation mask made of about 30 $\mu$m thick magnetic stainless steel sheet, and then the substrate and the mask were brought into contact with each other by placing a samarium-cobalt magnet on the back surface of the substrate. Then, this was placed in position within a vacuum deposition chamber, and aluminum was vacuum-deposited to form a first connection electrode 6 by the electron beam evaporation method. And then, with the metal mask closely adhered as shown above, an amorphous semiconductor layer 5 was formed on the substrate by using the resistance heating evaporation method. In which, nine kinds of compounds of arsenic and selenium were prepared as an evaporation source of the amorphous semiconductor layer 5, which have composition ratios of arsenic and selenium of about 1 atom %, about 5 atom %, about 10 atom %, about 25 atom %, about 40 atom %, about 50 atom %, about 60 atom %, about 80 atom % and about 85 atom %. The amorphous semiconductor layer 5 was vacuum-deposited to have a film thickness of about 1800 Å. A vacuum degree at a level of $1 \times 10^{-6}$ Torr was held during the vacuum deposition and a heater used was of a type made of molybdenum (Mo).

Next, after coated a photoresist film on the substrate as an insulator layer 9, removal of the resist film thus coated was made at a predetermined position and over a predetermined range of area on the amorphous semiconductor layer 5 by the photoetching processing thereby to form a contact hole 10 therethrough. In addition, with another metal mask, a second connection electrode 7 was formed by having aluminum vacuum-deposited thereon. Thus, the substrate having the nonlinear element formed thereon was obtained as shown in FIGS. 8(a) and (b).

Figure 10:
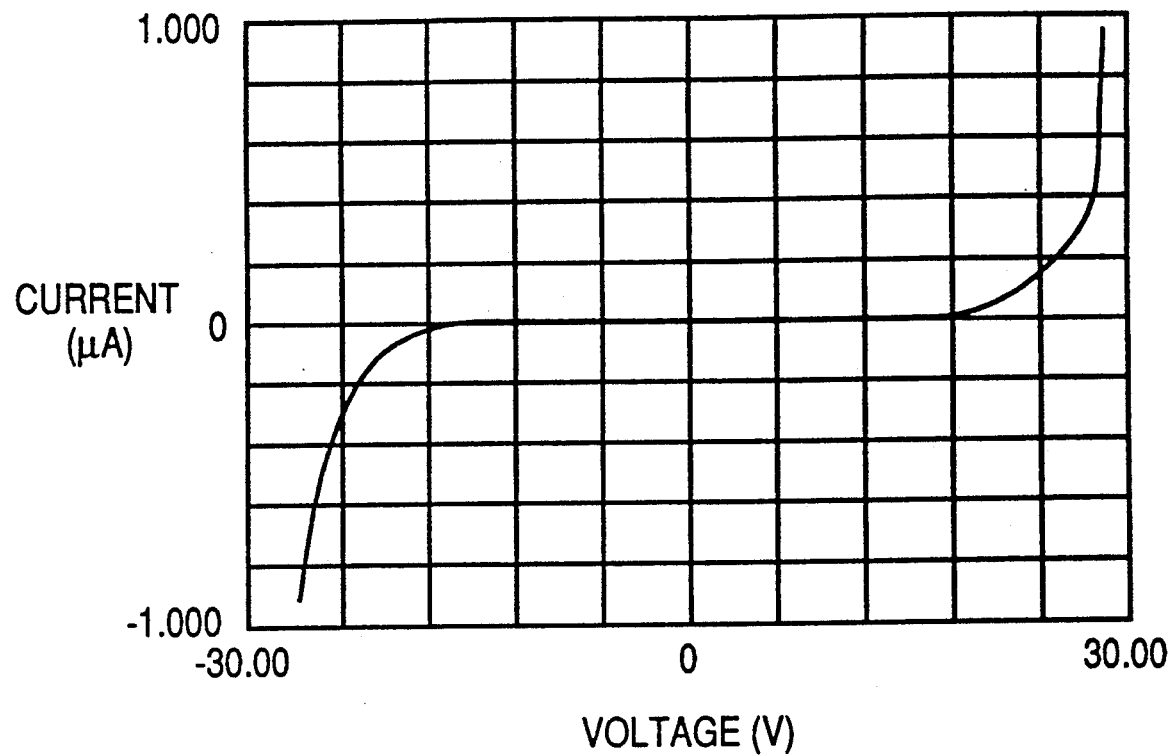
FIG. 10 shows a voltage-current characteristic of a nonlinear element of this invention.

Among the elements thus produced, those which have the composition ratios of arsenic and selenium for forming the amorphous semiconductor layer 5 other than about 1 atom % and 85 atom % exhibited almost similar electrical characteristics. FIG. 10 shows the voltage-current characteristic of the nonlinear elements produced as shown above. The current increases sharply at a voltage of about 17 volts. The electrical capacitance obtained was below one-tenth of that of the liquid crystal layer.

It is necessary to heat the substrate to a temperature at least 90° C. when filling the liquid crystal or forming an aligning film, etc. during a panel producing process. A nonlinear element having a composition ratio less than 10 atom %, however, became a glass transition temperature below 90° C. and was fractured during the heat treatment. On the other hand, a composition ratio of 85 atom % was not practical because of precipitation of arsenic during the heat treatment.

From the above results, it was found out that if a composition ratio of the compound of arsenic and selenium ranges from 10 to 80 atom %, then the nonlinear element produced can provide electrical characteristics which are suitable to satisfy the function as a nonlinear diode for use in a liquid crystal display unit.

Figure 11:
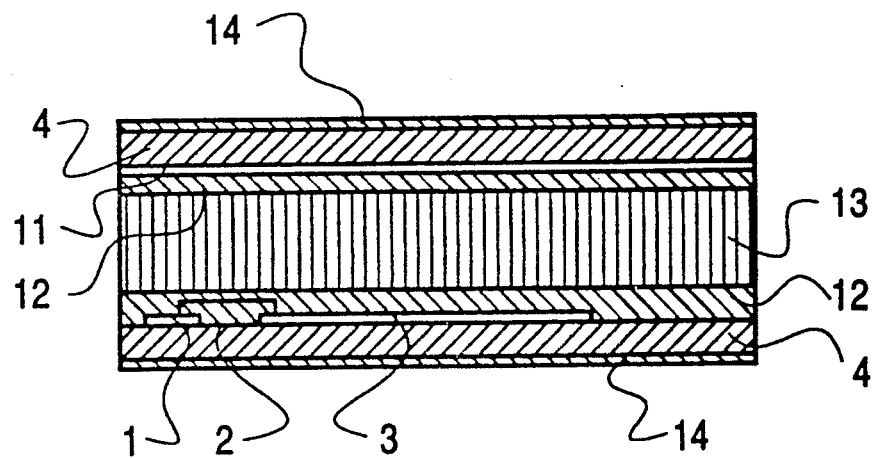
FIG. 11 is a sectional view of a liquid crystal display panel using a nonlinear element of this invention.

Then, a liquid crystal panel was manufactured using the substrate on which the nonlinear element thus produced had been formed. FIG. 11 is a sectional view of the panel. In which, an amorphous semiconductor layer 5, first connection electrode 6, second connection electrode 7 and insulator layer 9 are shown collectively as a nonlinear element 2. By referring to FIG. 11, the process of manufacturing the panel will be shown below. Aligning films 12 were formed on a substrate on which a nonlinear element 2 is formed and the substrate which is disposed confronting thereto and has a band-shaped ITO electrode 11 on the surface thereof, respectively. Thereafter, a rubbing process was carried out, two substrates were affixed with each other to form a panel and a liquid crystal 13 was injected. A polarizing plate 14 was affixed on the outside surface of each of the substrates. The rubbing process was carried out in such a direction that the molecules of liquid crystal become a structure with a twist angle of 90 degrees. The liquid crystal display panel provided with a nonlinear element was obtained through the processing steps mentioned above.

The panel has made it possible to realize a display at a contrast ratio of 10:1 or more during a matrix driving of a duty ratio of 1/1000 and a bias ratio of 1/7.

Further, it has been found out that when the compounds of sulphur and arsenic and the compounds of selenium and arsenic and sulphur are used under the same conditions as shown above as an evaporation source for forming an amorphous semiconductor layer 5, stable electrical characteristics result, if a composition ratio of arsenic ranges from 10 to 80 atom %.

EXAMPLE 2

A nonlinear element structured as shown in FIGS. 8(a) and (b) and a liquid crystal panel using it were manufactured. The manufacturing method thereof was the same as in Example 1. For an evaporating source of an amorphous semiconductor layer 5, powdered silicon and silicon nitride which were mixed and formed under pressure were used. In this example, the sources having a weight percent of powdered silicon and silicon nitride of 2:1, 1:1 and 1:2 were prepared. The formation of the amorphous semiconductor layer 5 was made through the electron beam evaporation and sputtering techniques. The contents of hydrogen atom in the deposited films was below 0.5 atom %, which means that the aging of characteristics due to escape of the hydrogen atoms from the amorphous semiconductor layer is extremely small. The film thickness thereof was about 15 Å.

The voltage-current characteristic of the element was sufficiently nonlinear and the capacitance thereof was considerably smaller than that of the liquid crystal layer.

EXAMPLE 3

A nonlinear element structured as shown in FIGS. 8(a) and (b) and a liquid crystal panel using it were manufactured. These were manufactured in the same method as in Example 1. For an evaporating source of an amorphous semiconductor layer 5, powdered boron and boron nitride which were mixed and formed under pressure were used. In this example, the sources having a weight percent of powdered boron and boron nitride of 2:1, 3:2 and 1:1 were prepared. The formation of the amorphous semiconductor layer 5 was made by the radio-frequency magnetron sputtering technique under the argon atmospheric condition, the thickness of which was about 2000 Å.

The voltage-current characteristic of the element was sufficiently nonlinear and the capacitance thereof was considerably smaller than that of the liquid crystal layer. Also, the nonlinearity thereof was unchangeable even when a light is irradiated.

Also, for the method of forming the amorphous semiconductor layer composed of a compound of boron and nitrogen, the reactive sputtering method in the mixed argon and nitrogen atmosphere can be introduced in addition to the radio-frequency magnetron sputtering method to obtain an element which can exert the same effects as above.

EXAMPLE 4

A nonlinear element structured as shown in FIGS. 8(a) and (bl) and a liquid crystal panel using it were manufactured in the same method as in Example 1. For an evaporating source of an amorphous semiconductor layer 5, powdered silicon and silicon carbide which were mixed and formed under pressure were used. In this example, the sources having a weight percent of powdered silicon and silicon carbide of 2:1, 1:1 and 1:2 were prepared. The formation of the amorphous semiconductor layer 5 was made by the radio-frequency magnetron sputtering method, the thickness of which was about 1500 Å.

The voltage-current characteristic of the element thus obtained was sufficiently nonlinear and the capacitance thereof was considerably smaller than that of the liquid crystal layer.

EXAMPLE 5

Figure 8B:
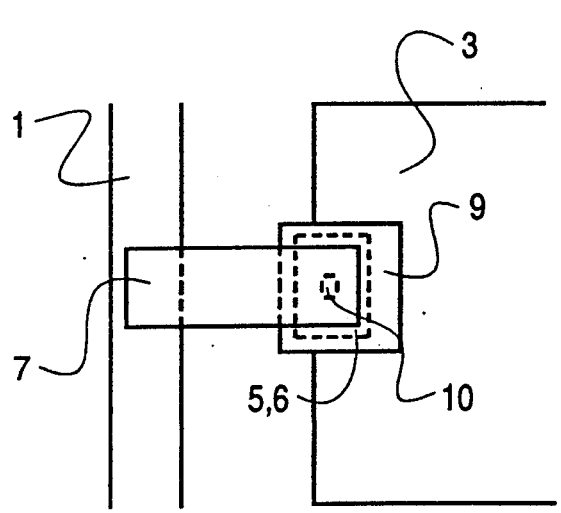

A nonlinear element structured as shown in FIGS. 8(al) and (b) and a liquid crystal panel using it were manufactured in the same method as in Example 1. For an evaporating source of an amorphous semiconductor layer 5, powdered aluminum and aluminum nitride which were mixed and formed under pressure were used. In this example, the sources having a weight percent of powdered aluminum and alumium nitride of 1:1, 1:2 and 1:3 were prepared. The formation of the amorphous semiconductor layer 5 was achieved by the radiofrequency magnetron sputtering method under the argon atmospheric condition thereby to obtain a film thickness of about 1800 Å.

The voltage-current characteristic of the element thus obtained was sufficiently nonlinear and the capacitance thereof was considerably smaller than that of the liquid crystal layer.

EXAMPLE 6

A nonlinear element structured as shown in FIGS. 8(a) and (b) and a liquid crystal panel using it were manufactured in the same method as in Example 1. For an evaporating source of an amorphous semiconductor layer 5, a gallium nitride in which zinc was mixed at a weight percent of 0.1 was used. The formation of the amorphous semiconductor layer 5 was achieved through the electron beam evaporation technique. In this example, film thicknesses of about 1200 Å, 1500 Å, 1800 Å and 2000 Å were prepared.

The voltage-current characteristics of the elements were sufficiently nonlinear and the capacitances thereof were considerably smaller than those of the liquid crystal layers, independent of the thickness o the amorphous semiconductor layer 5.

EXAMPLE 7

Figure 9B:
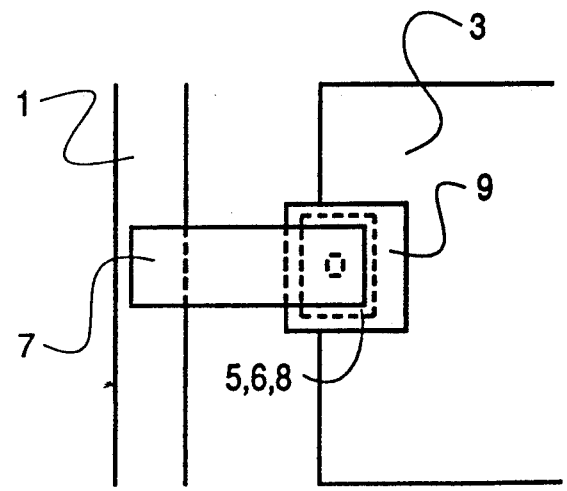

A nonlinear element structured as shown in FIGS. 9(al) and (bl) was manufactured, the manufacturing method of which was fundamentally similar to the method detailed in Example 1. An aluminum layer of about 1000 Å thick as a first connection electrode 6, a silicon layer 8 of about 1000 Å thick and an amorphous semiconductor layer 5 of the compound of arsenic and selenium having a composition ratio of arsenic of about 40 atom % were vacuum-deposited successively in this order. Then, the silicon layer 8 of about 1000 Å thick was successively formed thereon with the same metal mask. For the amorphous semiconductor layer 5, film thicknesses of about 1300 Å, 1500 Å, 1800 Å, 2000 Å and 2200 Å were prepared. Next, after a photoresist film has been coated on the substrate as an insulator layer 9 in the same way as shown in Example 1, a contact hole 10 was provided through the photoetching processing. In addition, an aluminum layer of about 4000 Å thick was formed as a second connection electrode 7.

The voltage-current characteristics of the elements thus obtained were sufficiently nonlinear and the capacitances thereof were considerably smaller than those of the liquid crystal layers.

In the examples shown above, we used the method of using a metal mask for patterning to form an amorphous semiconductor layer 5 and connection electrodes, 6 and 7, however, we were above to obtain the elements of the same pattern even when the lift-off method of photolithography method was applied therefor.

Further, we proposed here a photoresist film as an example of an insulator layer 9, however, there is no problem to use other insulating materials if they permit to provide dielectric characteristics between the amorphous semiconductor layer and conductor layers. For example, yttrium oxide, silicon dioxide, etc. can be used for this purpose.

Also, in the examples shown above, the use of aluminum material is proposed for forming the first and second connection electrodes, 6 and 7, we have found out that the use of tellurium, titanium and chromium and the composite use of them can exert the same effects thereon.

By the way, if a voltage attenuation due to electrode resistance brings out a problem to the display characteristics, it is preferable to coat the bus bar 1 with a highly conductive material such as aluminum(Al). Still further, we proposed here the use of liquid crystal as a display medium, it is needless to say, however, that other display elements such as an electroluminescence display, electrophoretic image display, electrochemical display, plasma display panel, etc. can be used in lieu of it.

What is claimed is:

1. A liquid crystal matrix display unit which comprises: substrates confronting each other; a liquid crystal layer provided between said substrates; a plurality of bus bars formed on at least one of said substrates; a plurality of pixel electrodes formed on said at least one of said substrates; and a plurality of diode means each consisting of a single amorphous semiconductor layer disposed between each of said bus bars and each of said plurality of pixel electrodes, each of said diode means for forming a diode having a nonlinear voltage-current characteristics due to the bulk effect of said amorphous semiconductor layer for selectively providing an electrical connection therebetween according to a voltage applied therebetween, wherein said amorphous semiconductor layer is made of a compound of arsenic and at least one of selenium and sulphur.

2. A liquid crystal matrix display unit as set forth in claim 1, wherein an insulating layer is formed on at least one of the upper and lower surfaces of said amorphous semiconductor layer to increase the uniformity of the nonlinear voltage-current characteristic of said diode.

3. A liquid crystal matrix display unit as set forth in claim 2, wherein said insulating layer is made of a photosensitive material so that it can be patterned by photoetching.

4. A liquid crystal matrix display unit as set forth in claim 1, further comprising conductor layers made of a same material and formed on an upper and a lower surface of said amorphous semiconductor layers, respectively, so as to obtain a symmetricality of the nonlinear voltage-current characteristic of said diode.

5. A liquid crystal matrix display unit as set forth in claim 4, wherein each of said conductor layers is made of at least one of aluminum, tellurium, titanium and chromium.

6. A liquid crystal matrix display unit as set forth in claim 1, wherein a silicon layer is formed on at least one of the upper and lower surfaces of said amorphous semiconductor layer so as to enhance the stability of the nonlinear voltage-current characteristic of said diode and so as to lower the off-current of said diode.

7. A liquid crystal matrix display unit as set forth in claim 1, wherein said amorphous semiconductor layer has a composition ratio in atomic percent of arsenic ranging from 10 to 80.

8. A liquid crystal matrix display unit which comprises: substrates confronting each other; a liquid crystal layer provided between said substrates; a plurality of bus bars formed on at least one of said substrates; a plurality of pixel electrodes formed on said at least one of said substrates; and a plurality of diode means each consisting of a single amorphous semiconductor layer disposed between each of said bus bars and each of said plurality of pixel electrodes, each of said plurality of diode means for forming a diode having a nonlinear voltage-current characteristics due to the bulk effect of said amorphous semiconductor layer for selectively providing an electrical connection therebetween according to a voltage applied therebetween, wherein said amorphous semiconductor layer is made of a compound of nitrogen and at least one of silicon, boron, aluminum and gallium.

9. A liquid crystal matrix display unit as set forth in claim 8, wherein insulating layer is formed on at least one of the upper and lower surfaces of said amorphous semiconductor layer to increase the uniformity of the nonlinear voltage-current characteristic of said diode.

10. A liquid crystal matrix display unit as set forth in claim 9, wherein said insulating layer is made of a photosensitive material so that it can be patterned by photoetching.

11. A liquid crystal matrix display unit as set forth in claim 8, further comprising conductor layers made of a same material and formed on an upper and a lower surface of said amorphous semiconductor layer, respectively, so as to obtain a symmetricality of the nonlinear voltage-current characteristic of said diode.

12. A liquid crystal matrix display unit as set forth in claim 11, wherein each of said conductor layers is made of at least one of aluminum, tellurium, titanium and chromium.

13. A liquid crystal matrix display unit as set forth in claim 8, wherein a silicon layer is formed on at least one of the upper and lower surfaces of said amorphous semiconductor layer so as to enhance the stability of the nonlinear voltage-current characteristic of said diode and to lower the off-current of said diode.

14. A liquid crystal matrix display unit which comprises: substrates confronting each other; a liquid crystal layer provided between said substrates; a plurality of bus bars formed on at least one of said substrates; and a plurality of pixel electrodes formed on said at least one of said substrates; and a plurality of diode means each consisting of a single amorphous semiconductor layer disposed between each of said bus bars and each of said plurality of pixel electrodes, each of said plurality of diode means for forming a diode having a nonlinear voltage-current characteristics due to the bulk effect of said amorphous semiconductor layer for selectively providing an electrical connection therebetween according to a voltage applied therebetween, wherein said amorphous semiconductor layer is made of a compound of carbon and silicon.

15. A liquid crystal matrix display unit as set forth in claim 14, wherein an insulating layer is formed on at least one of the upper and lower surfaces of said amorphous semiconductor layer to increase the uniformity of the nonlinear voltage-current characteristic of said diode.

16. A liquid crystal matrix display unit as set forth in claim 15, wherein said insulating layer is made of a photosensitive material so that it can be patterned by photoetching.

17. A liquid crystal matrix display unit as set forth in claim 14, further comprising conductor layers made of a same material and formed on an upper and a lower surface of said amorphous semiconductor layer, respectively, so as to obtain a symmetricality of the nonlinear voltage-current characteristic of said diode.

18. A liquid crystal matrix display unit as set forth in claim 17, wherein each of said conductor layers is made of at least one of aluminum, tellurium, titanium and chromium.

19. A liquid crystal matrix display unit as set forth in claim 14, wherein a silicon layer is formed on at least one of the upper and lower surfaces of said amorphous semiconductor layer so as to enhance the stability of the nonlinear voltage-current characteristic of said diode and so as to lower the off-current of said diode.

20. A liquid crystal matrix display unit which comprises: substrates confronting each other; a liquid crystal layer provided between said substrates; a plurality of bus bars formed on a last one of said substrates; a plurality of pixel electrodes formed on said at least one of said substrates; and a plurality of diode means each consisting of a single amorphous semiconductor layer disposed between each of said bus bars and each of said plurality of pixel electrodes, each of said plurality of diode means for forming a diode having a nonlinear voltage-current characteristics due to the bulk effect of said amorphous semiconductor layer for selectively providing an electrical connection therebetween according to a voltage applied therebetween, wherein said amorphous semiconductor layer is made of a compound of boron.

21. A liquid crystal matrix display unit as set forth in claim 20, wherein an insulating layer is formed on at least one of the upper and power surfaces of said amorphous semiconductor layer to increase the uniformity of the nonlinear voltage-current characteristic of said diode.

22. A liquid crystal matrix display unit as set forth in claim 21, wherein said insulating layer is made of a photosensitive material so that it can be patterned by photoetching.

23. A liquid crystal matrix display unit as set forth in claim 20, further comprising conductor layers made of a same material and formed on an upper and a lower surface of said amorphous semiconductor layer, respectively, so as to obtain a symmetricality of the nonlinear voltage-current characteristic of said diode.

24. A liquid crystal matrix display unit as set forth in claim 23, wherein each of said conductor layers is made of at least one of aluminum, tellurium, titanium and chromium.

25. A liquid crystal matrix display unit as set forth in claim 20, wherein a silicon layer is formed on at least one of the upper and lower surfaces of said amorphous semiconductor layer so as to enhance the stability of the nonlinear voltage-current characteristic of said diode and so as to lower the off-current of said diode.

* * * * *